United States Patent
Liu

(10) Patent No.: US 10,741,798 B1
(45) Date of Patent: Aug. 11, 2020

(54) ORGANIC LIGHT EMITTING DIODE DISPLAY PANEL AND METHOD OF MANUFACTURING SAME

(71) Applicant: Shenzhen China Star Optoelectronics Semiconductor Display Technology Co., Ltd., Shenzhen, Guangdong (CN)

(72) Inventor: Hualong Liu, Guangdong (CN)

(73) Assignee: Shenzhen China Star Optoelectronics Semiconductor Display Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 16/347,583

(22) PCT Filed: Apr. 15, 2019

(86) PCT No.: PCT/CN2019/082643
§ 371 (c)(1),
(2) Date: May 5, 2019

(30) Foreign Application Priority Data

Jan. 18, 2019 (CN) .......................... 2019 1 0049575

(51) Int. Cl.
*H01L 51/56* (2006.01)

(52) U.S. Cl.
CPC ........ *H01L 51/56* (2013.01); *H01L 2251/305* (2013.01); *H01L 2251/558* (2013.01)

(58) Field of Classification Search
CPC ............... H01L 51/56; H01L 2251/305; H01L 2251/558
See application file for complete search history.

(56) References Cited

U.S. PATENT DOCUMENTS

| | | | |
|---|---|---|---|
| 2011/0134196 A1 | 6/2011 | Kim et al. | |
| 2015/0144912 A1* | 5/2015 | Park | H01L 51/5256 257/40 |
| 2018/0033964 A1* | 2/2018 | Liu | H01L 51/5056 |
| 2018/0108839 A1* | 4/2018 | Hao | H01L 51/0004 |
| 2018/0138157 A1* | 5/2018 | Im | H01L 33/387 |
| 2018/0180682 A1* | 6/2018 | Miller | G06F 30/20 |
| 2018/0183012 A1* | 6/2018 | Liu | H01L 51/5237 |
| 2018/0205026 A1* | 7/2018 | Zhou | H01L 51/5072 |
| 2018/0241009 A1* | 8/2018 | Liu | H01L 51/001 |

FOREIGN PATENT DOCUMENTS

| | | |
|---|---|---|
| CN | 104377311 A | 2/2015 |
| CN | 105895818 A | 8/2016 |
| CN | 105914224 A | 8/2016 |
| CN | 109192765 A | 1/2019 |

\* cited by examiner

*Primary Examiner* — Victor A Mandala
(74) *Attorney, Agent, or Firm* — Mark M. Friedman

(57) ABSTRACT

An organic light emitting diode (OLED) display panel includes a display device substrate, a cofferdam, a transparent conductive metal layer disposed on the display device substrate, and a light-emitting layer disposed on the transparent conductive metal layer. A cushion layer made of a hydrophilic material is disposed around an active area on the display device substrate, and the cofferdam is disposed on the cushion layer. The transparent conductive metal layer extends obliquely upward toward a direction close to the cushion layer and a periphery of the transparent conductive metal layer is on the cushion layer.

16 Claims, 6 Drawing Sheets

ORGANIC LIGHT EMITTING DIODE DISPLAY PANEL AND METHOD OF MANUFACTURING SAME

FIELD OF INVENTION

The present disclosure relates to the field of display technologies, and more particularly to an organic light emitting diode (OLED) display panel and a method of manufacturing same.

BACKGROUND OF INVENTION

Organic light emitting diode (OLED) devices have been widely used in a display field, a lighting field, and smart wearable device field due to having advantages such as good self-illumination, high contrast, and fast response.

Referring to FIG. 1, when manufacturing the Organic light emitting diode device by a printing technology, a dam 12 is formed after a transparent conductive metal film 11 is patterned, and a periphery of the transparent conductive metal film 11 overlaps with the dam 12, and the organic light emitting diode device is printed in a region surrounded by the dam 12.

However, the transparent conductive metal film 11 is hydrophilic substance and the dam 12 surrounding the transparent conductive metal film 11 is hydrophobic substance. Since the side edge of the dam 12 in contact with the transparent conductive metal film 11 is less hydrophobic than the top of the dam 12, and printed ink droplets are liquid substances, there is a phenomenon that an ink film layer may "climb up" along a side surface of the dam 12 during the process of drying, causing that a periphery thickness of the ink film layer is much thicker than a central thickness of the ink film layer, thereby causing there is no light emission or the light emission is weak in the periphery of the organic light emitting diode device, which affects the display performance.

SUMMARY OF INVENTION

An embodiment of the present disclosure provides an organic light emitting diode (OLED) display panel including a display device substrate, a cofferdam disposed around an active area on the display device substrate, a transparent conductive metal layer disposed on the display device substrate and located inside the cofferdam, and a light-emitting layer disposed on the transparent conductive metal layer. A cushion layer made of a hydrophilic material is disposed around the active area on the display device substrate, and the cofferdam is disposed on the cushion layer. The transparent conductive metal layer extends obliquely upward toward a direction close to the cushion layer and a periphery of the transparent conductive metal layer is on the cushion layer, and an overall shape of a longitudinal section of the transparent conductive metal layer is an elliptical arc or a circular arc, and an inner side of the cushion layer is disposed obliquely downward toward a direction close to the active area.

Further, a slope of the inner side of the cushion layer is 5 to 45 degrees.

Further, a thickness of the transparent conductive metal layer is 10 to 200 nanometers.

Further, a thickness of the cushion layer is 20 to 200 nanometers.

An embodiment of the present disclosure further provides an OLED display panel including a display device substrate, a cofferdam disposed around an active area on the display device substrate, a transparent conductive metal layer disposed on the display device substrate and located inside the cofferdam, and a light-emitting layer disposed on the transparent conductive metal layer. A cushion layer made of a hydrophilic material is disposed around the active area on the display device substrate, and the cofferdam is disposed on the cushion layer. The transparent conductive metal layer extends obliquely upward toward a direction close to the cushion layer and a periphery of the transparent conductive metal layer is on the cushion layer.

Further, an overall shape of a longitudinal section of the transparent conductive metal layer is an elliptical arc or a circular arc.

Further, an inner side of the cushion layer is disposed obliquely downward toward a direction close to the active area.

Further, a slope of the inner side of the cushion layer is 5 to 45 degrees.

Further, a thickness of the transparent conductive metal layer is 10 to 200 nanometers.

Further, a thickness of the cushion layer is 20 to 200 nanometers.

An embodiment of the present disclosure further provides a method for manufacturing an OLED display panel, the method includes the following steps:

step S10, providing a display device substrate;

step S20, forming a cushion layer around an active area on the display device substrate by a hydrophilic material;

step S30, forming a transparent conductive metal layer on an inner side of the cushion layer, wherein the transparent conductive metal layer extends obliquely upward toward a direction close to the cushion layer, and aperiphery of the transparent conductive metal layer is on the cushion layer;

step S40, forming a cofferdam around an active area on the cushion layer;

step S50, forming a light-emitting layer on the transparent conductive metal layer.

Further, an overall shape of a longitudinal section of the transparent conductive metal layer is an elliptical arc or a circular arc.

Further, an inner side of the cushion layer is disposed obliquely downward toward a direction close to the active area.

Further, a slope of the inner side of the cushion layer is 5 to 45 degrees.

Further, a thickness of the transparent conductive metal layer is 10 to 200 nanometers.

Further, a thickness of the cushion layer is 20 to 200 nanometers.

Beneficial performance of an embodiment of the present disclosure is that the height of the central portion of the transparent conductive metal layer is lower than the height of the periphery thereof raising the height of the periphery of the transparent conductive metal layer by the cushion layer. When forming the light-emitting layer on the transparent conductive metal layer by the inkjet printing process, although there is still a climbing phenomenon, the film thickness of the periphery of the light-emitting layer can be made close to or equal to the film thickness of the central portion thereof by controlling the film thickness of the cushion layer, therefore the light emission of the periphery and the central portion of the light-emitting layer tends to be substantially uniform, thereby improving the display performance of the OLED display panel.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
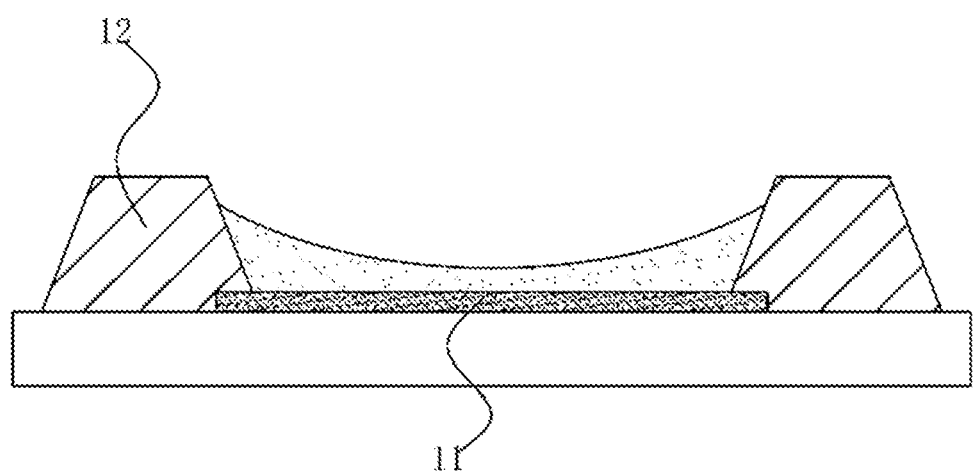
FIG. 1 is a schematic structure diagram of an organic light emitting diode (OLED) device according to the prior art.

The following description of the various embodiments is provided to illustrate the specific embodiments. Directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to limit the present disclosure. In the drawings, units with similar structures are labeled with the same reference number.

The embodiment of the present disclosure can solve defects of the prior art, in which an organic light emitting diode (OLED) display panel of the prior art, there is a phenomenon that the periphery film thickness is much thicker than the central thickness, while manufacturing the OLED, thereby causing the light emission of the periphery to be weak or not to emit light.

Figure 2:
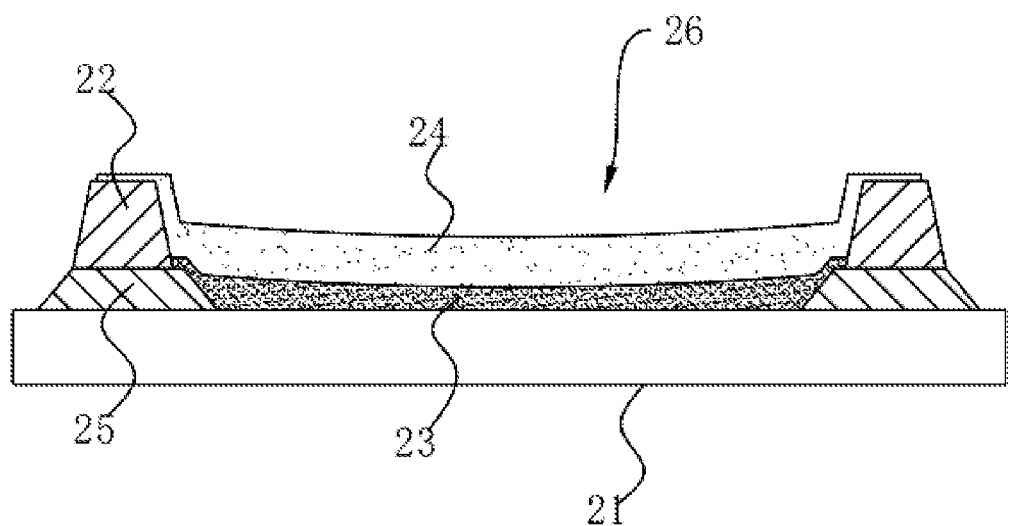
FIG. 2 is a schematic structure diagram of an OLED display panel according to an embodiment of the present disclosure.

Referring to FIG. 2, an OLED display panel includes a display device substrate 21, a cofferdam 22 disposed around an active area 26 on the display device substrate 21, a transparent conductive metal layer 23 (Indium Tin Oxide, ITO) disposed on the display device substrate 21 and located inside the cofferdam 22, and the light-emitting layer 24 disposed on the transparent conductive metal layer 23.

A cushion layer 25 made of a hydrophilic material is disposed around the active area 26 on the display device substrate 21, and the cofferdam 22 is disposed on the cushion layer 25. The transparent conductive metal layer 23 extends obliquely upward toward a direction close to the cushion layer 25 and a periphery of the transparent conductive metal layer 23 is on the cushion layer 25.

It should be noted that the material of the cushion layer 25 can be a hydrophilic organics substance or a hydrophilic inorganic substance. In an embodiment, the material of the cushion layer 25 is silicon oxide or silicon nitride.

By raising the height of the periphery of the transparent conductive metal layer 23 by the cushion layer 25, the height of the central portion of the transparent conductive metal layer 23 is lower than the height of the periphery thereof. When forming the light-emitting layer 24 on the transparent conductive metal layer 23 by the inkjet printing process, although there is still a climbing phenomenon, the film thickness of the periphery of the light-emitting layer 24 can be made similar to or equal to the film thickness of the central portion thereof by controlling the film thickness of the cushion layer 24, therefore the light emission of the periphery and the central portion of the light-emitting layer 24 tends to be substantially uniform, thereby improving the display performance of the OLED display panel.

Specifically, an overall shape of a longitudinal section of the transparent conductive metal layer 23 is an elliptical arc or a circular arc.

By forming the transparent conductive metal layer 23 having the elliptical arc shape or the circular arc shape, the contact area of the transparent conductive metal layer 23 and the light-emitting layer 24 is increased, thereby increasing the pixel aperture ratio.

In detail, an inner side of the cushion layer 25 is disposed obliquely downward toward a direction close to the active area 26, and the periphery of the transparent conductive metal layer 23 extends along the inner side of the cushion layer 25 to the upper surface of the cushion layer 25.

The climbing height of the periphery of the light-emitting layer 24 can be adjusted in a way of controlling the slope of the cushion layer 25, so that the periphery film thickness of the light-emitting layer 24 substantially coincides with the central film thickness thereof.

Further, the slope of the inner side of the cushion layer 25 is 5 to 45 degrees.

In detail, the thickness of the cushion layer 25 is 20 to 200 nanometers, the thickness of the transparent conductive metal layer 23 is 10 to 200 nanometers, and the thickness of the cofferdam 22 is 1 to 2 millimeter.

Figure 3:
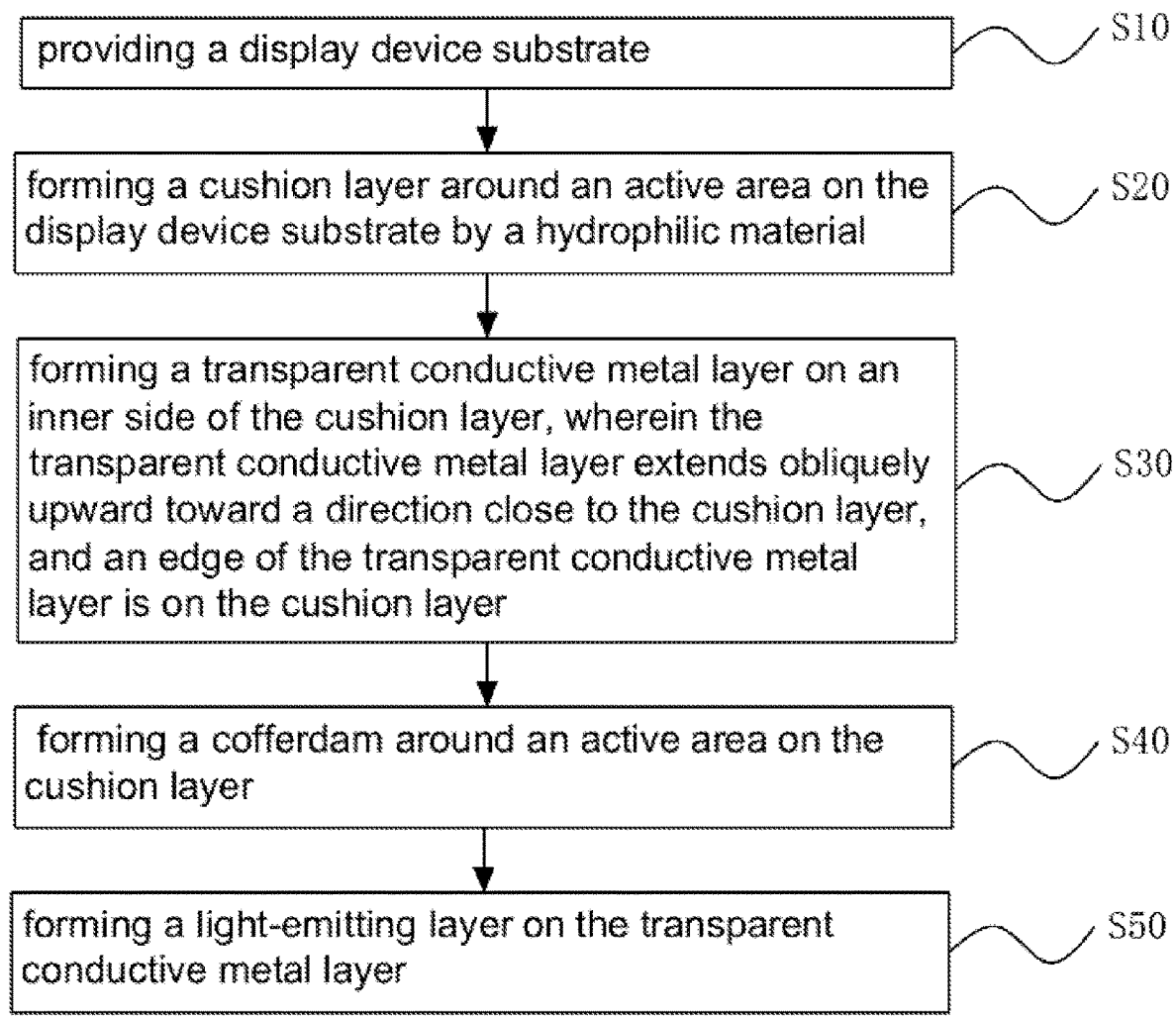
FIG. 3 is a flow chart of steps for manufacturing an OLED display panel according to an embodiment of the present disclosure.

Referring to FIG. 3, the present disclosure further provides a method for manufacturing an OLED display panel, the method includes the following steps:

step S10, providing a display device substrate 21;

step S20, forming a cushion layer 25 around an active area 26 on the display device substrate 21 by a hydrophilic material;

step S30, forming a transparent conductive metal layer 23 on an inner side of the cushion layer 25, and the transparent conductive metal layer 23 extending obliquely upward toward a direction close to the cushion layer 25;

step S40, forming a cofferdam 22 around an active area 26 on the cushion layer 25;

step S50, forming a light-emitting layer 24 on the transparent conductive metal layer 23.

Figure 4:
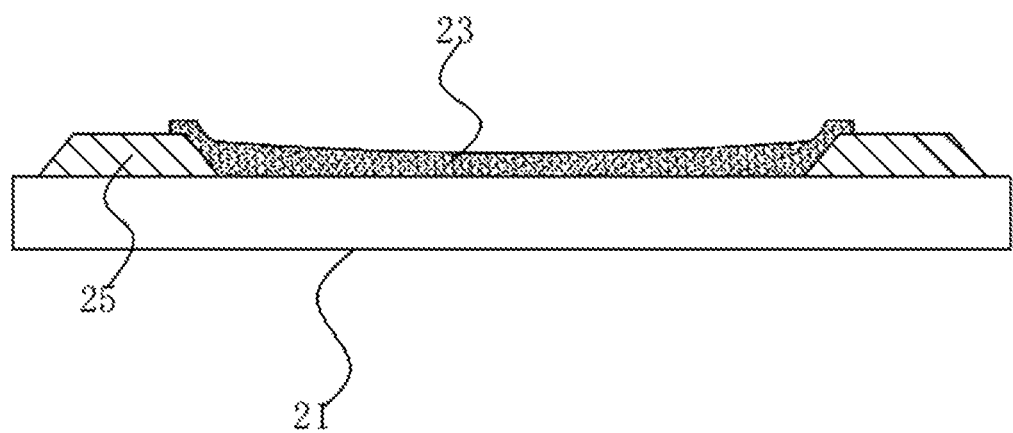
FIG. 4 to FIG. 6 are schematic diagrams showing a preparation process of an OLED display panel according to an embodiment of the present disclosure.
Figure 5:
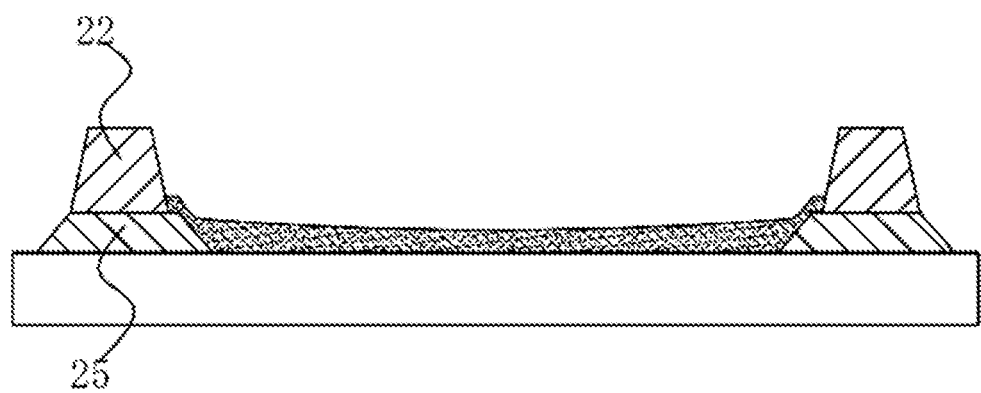
Figure 6:
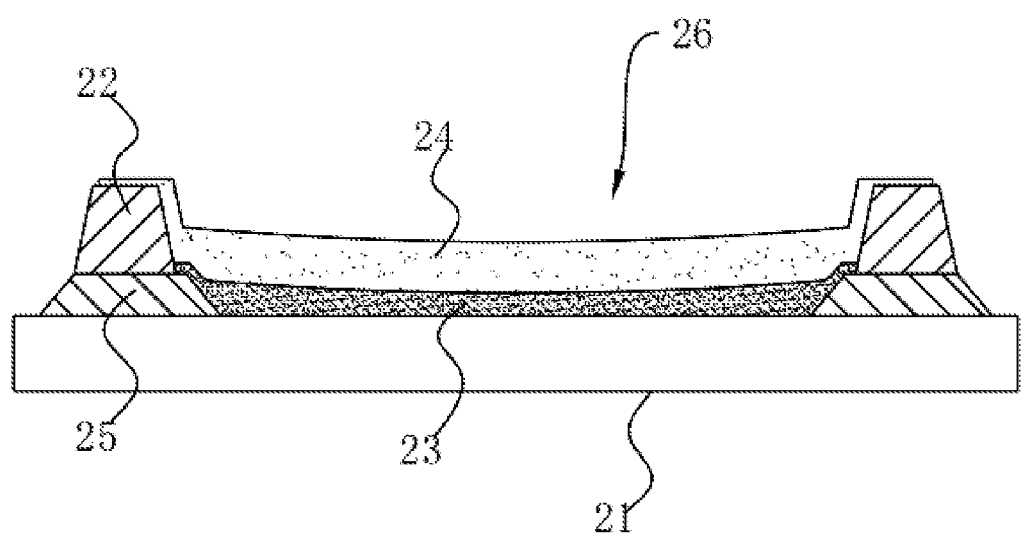

Referring to FIG. 4 to FIG. 6, FIG. 4 to FIG. 6 are schematic diagrams showing a preparation process of an OLED display panel according to an embodiment of the present disclosure.

Referring to FIG. 4, after forming the cushion layer 25 around the active area 26 on the display device substrate 21, the transparent conductive metal layer 23 is formed inside the cushion layer 25, and the periphery of the transparent conductive metal layer 23 extends onto the cushion layer 25.

It should be noted that the material of the cushion layer 25 can be a hydrophilic organics substance or a hydrophilic inorganic substance. In an embodiment, the material of the cushion layer 25 is silicon oxide or silicon nitride.

Specifically, the overall shape of a longitudinal section of the transparent conductive metal layer 23 is an elliptical arc or a circular arc.

An inner side of the cushion layer 25 is disposed obliquely downward toward a direction close to the active area 26.

Further, the slope of the inner side of the cushion layer 25 is 5 to 45 degrees.

By raising the height of the periphery of the transparent conductive metal layer 23 by the cushion layer 25, the height of the central portion of the transparent conductive metal layer 23 is lower than the height of the periphery thereof. When forming the light-emitting layer 24 on the transparent conductive metal layer 23 by the inkjet printing process, although there is still a climbing phenomenon, the film thickness of the periphery of the light-emitting layer 24 can be made similar to or equal to the film thickness of the central portion thereof by controlling the film thickness of the cushion layer 24, therefore the light emission of the periphery and the central portion of the light-emitting layer 24 tends to be substantially uniform, thereby improving the display performance of the OLED display panel.

In detail, the thickness of the cushion layer 25 is 20 to 200 nanometers, and the thickness of the transparent conductive metal layer 23 is 10 to 200 nanometers.

Referring to FIG. 5, the cofferdam 22 is formed around an active area 26 on the cushion layer 25, and the thickness of the cofferdam 22 is 1 to 2 millimeters.

Referring to FIG. 6, the droplets are printed on the transparent conductive metal layer 23 by the inkjet printing, and the droplets are dried to form the light-emitting layer 24 having an elliptical arc or a circular arc as a whole. The periphery film thickness of the light-emitting layer 24 is close to or equal to the central film thickness of the light-emitting layer 24.

Beneficial performance of the present disclosure is that the height of the central portion of the transparent conductive metal layer 23 is lower than the height of the periphery thereof raising the height of the periphery of the transparent conductive metal layer 23 by the cushion layer 25. When forming the light-emitting layer 24 on the transparent conductive metal layer 23 by the inkjet printing process, the film thickness of the periphery of the light-emitting layer 24 can be made close to or equal to the film thickness of the central portion thereof by controlling the film thickness of the cushion layer 25, therefore the light emission of the periphery and the central portion of the light-emitting layer 24 tends to be substantially uniform, thereby improving the display performance of the OLED display panel. Further, by forming the transparent conductive metal layer 23 having the elliptical arc shape or the circular arc shape, the contact area of the transparent conductive metal layer 23 and the light-emitting layer 24 is increased, thereby increasing the pixel aperture ratio.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. An organic light emitting diode (OLED) display panel, comprising:
   a display device substrate;
   a cofferdam disposed around an active area on the display device substrate;
   a transparent conductive metal layer disposed on the display device substrate and located inside the cofferdam; and
   a light-emitting layer disposed on the transparent conductive metal layer;
   wherein a cushion layer made of a hydrophilic material is disposed around the active area on the display device substrate, and the cofferdam is disposed on the cushion layer;
   wherein the transparent conductive metal layer extends obliquely upward toward a direction close to the cushion layer and a periphery of the transparent conductive metal layer is on the cushion layer, and an overall shape of a longitudinal section of the transparent conductive metal layer is an elliptical arc or a circular arc, and an inner side of the cushion layer is disposed obliquely downward toward a direction close to the active area.

2. The OLED display panel according to claim 1, wherein a slope of the inner side of the cushion layer is 5 to 45 degrees.

3. The OLED display panel according to claim 1, wherein a thickness of the transparent conductive metal layer is 10 to 200 nanometers.

4. The OLED display panel according to claim 3, wherein a thickness of the cushion layer is 20 to 200 nanometers.

5. An organic light emitting diode (OLED) display panel, comprising:
   a display device substrate;
   a cofferdam disposed around an active area on the display device substrate;
   a transparent conductive metal layer disposed on the display device substrate and located inside the cofferdam; and
   a light-emitting layer disposed on the transparent conductive metal layer;
   wherein a cushion layer made of a hydrophilic material is disposed around the active area on the display device substrate, and the cofferdam is disposed on the cushion layer;
   wherein the transparent conductive metal layer extends obliquely upward toward a direction close to the cushion layer and a periphery of the transparent conductive metal layer is on the cushion layer.

6. The OLED display panel according to claim 5, wherein an overall shape of a longitudinal section of the transparent conductive metal layer is an elliptical arc or a circular arc.

7. The OLED display panel according to claim 5, wherein an inner side of the cushion layer is disposed obliquely downward toward a direction close to the active area.

8. The OLED display panel according to claim 7, wherein a slope of the inner side of the cushion layer is 5 to 45 degrees.

9. The OLED display panel according to claim 5, wherein a thickness of the transparent conductive metal layer is 10 to 200 nanometers.

10. The OLED display panel according to claim 9, wherein a thickness of the cushion layer is 20 to 200 nanometers.

11. A method for manufacturing an organic light emitting diode (OLED) display panel, comprising a plurality of steps:
    step S10, providing a display device substrate;
    step S20, forming a cushion layer around an active area on the display device substrate by a hydrophilic material;
    step S30, forming a transparent conductive metal layer on an inner side of the cushion layer, wherein the transparent conductive metal layer extends obliquely upward toward a direction close to the cushion layer, and a periphery of the transparent conductive metal layer is on the cushion layer;
    step S40, forming a cofferdam around an active area on the cushion layer;
    step S50, forming a light-emitting layer on the transparent conductive metal layer.

12. The method for manufacturing the OLED display panel according to claim 11, wherein an overall shape of a longitudinal section of the transparent conductive metal layer is an elliptical arc or a circular arc.

13. The method for manufacturing the OLED display panel according to claim 11, wherein an inner side of the cushion layer is disposed obliquely downward toward a direction close to the active area.

14. The method for manufacturing the OLED display panel according to claim 13, wherein a slope of the inner side of the cushion layer is 5 to 45 degrees.

15. The method for manufacturing the OLED display panel according to claim 11, wherein a thickness of the transparent conductive metal layer is 10 to 200 nanometers.

16. The method for manufacturing the OLED display panel according to claim 15, wherein a thickness of the cushion layer is 20 to 200 nanometers.

\* \* \* \* \*